United States Patent [19]

Dockrey

[11] Patent Number: 4,799,991
[45] Date of Patent: Jan. 24, 1989

[54] PROCESS FOR PREFERENTIALLY ETCHING POLYCRYSTALLINE SILICON

[75] Inventor: Jasper W. Dockrey, Pflugerville, Tex.

[73] Assignee: Motorola, Inc., Schaumburg, Ill.

[21] Appl. No.: 115,307

[22] Filed: Nov. 2, 1987

[51] Int. Cl.$^4$ .......................................... H01L 21/302
[52] U.S. Cl. .................................. 156/643; 156/646; 156/657; 156/659.1; 156/662
[58] Field of Search ............ 156/646, 643, 657, 659.1, 156/662

[56] References Cited

U.S. PATENT DOCUMENTS

| 4,380,489 | 4/1983 | Beinvogl et al. | 156/643 |
| 4,417,947 | 11/1983 | Pan | 156/643 |
| 4,422,897 | 12/1983 | Horwitz et al. | 156/643 |
| 4,426,246 | 1/1984 | Kravitz et al. | 156/643 |
| 4,430,151 | 2/1984 | Tsukada | 156/643 X |
| 4,468,285 | 8/1984 | Bayman et al. | 156/643 |
| 4,471,522 | 9/1984 | Jambotkar | 156/643 X |
| 4,490,209 | 12/1984 | Hartman | 156/643 |
| 4,528,066 | 7/1985 | Merkling, Jr. et al. | 156/643 |

OTHER PUBLICATIONS

Coburn, "Plasma-Assisted Etching", source unknown.
Horwitz, "Reactive Sputter Etching of Silicon with Very Low Mask-Material Etch Rates", IEEE Transactions on Electron Devices, ined-28, No. 11, Nov. 1981, pp. 1320-1323.
Cabral et al., "Fabrication of Submicrometer Size Structures in Si Using SiCl$_4$/O$_2$ Reactive Ion Etching", source unknown.

Primary Examiner—Kenneth M. Schor
Assistant Examiner—Thi Dang
Attorney, Agent, or Firm—John A. Fisher

[57] ABSTRACT

This disclosure relates to a process for etching polycrystalline silicon in preference to single crystal silicon. Polycrystalline silicon is anisotropically etched in a plasma which inclues a noncarbonaceus silicon etching compound such as chlorine together with about 0.4–1.5 percent by volume of oxygen. The process is used to fabricate semiconductor devices which require the etching of polycrystalline silicon in the presence of exposed monocrystalline silicon.

14 Claims, 3 Drawing Sheets

PROCESS FOR PREFERENTIALLY ETCHING POLYCRYSTALLINE SILICON

BACKGROUND OF THE INVENTION

This invention relates generally to a process for etching polycrystalline silicon, and more specifically to a process for etching polycrystalline silicon in preference to monocrystalline silicon and to the use of this process in the fabrication of semiconductor devices.

The processing of semiconductor devices often requires the etching of one layer relative to another layer. That is, the process often requires that one layer is etched while another layer is not etched at all or is only etched very slowly. As the vast body of knowledge has grown regarding the processing of semiconductor devices, various etch chemistries have been developed for etching one material relative to another. For example, both wet and dry etch chemistries have been developed which allow the preferential etching of silicon nitride with respect to photoresist or silicon dioxide, silicon dioxide with respect to photoresist, silicon nitride, silicon, or silicon with respect to oxides, nitrides, or the like. As a specific example, it is known that the etch rate of silicon can be enhanced, relative to the etch rate of silicon dioxide, by etching the silicon in a chlorine plasma to which a small amount of oxygen has been added. In total there are a large number of etching recipes which allow the etching of almost any material in preference to almost any other material. In addition, etching recipes have been developed which allow the preferential etching to proceed either isotropically or anisotropically where the term anisotropically means that the etching proceeds more rapidly in one direction, usually vertically, than in another direction. Herein the terms horizontal and vertical refer to the directions parallel and perpendicular to the major surface of the substrate being operated upon.

Each of the above referenced etching recipes, however, relates to the etching of one material in contrast to a chemically different material. There has not been developed an etching process, and especially an anisotropic etching process, which etches one crystalline form of a material more rapidly than another crystalline form of the same material. Specifically, heretofore there has not been developed an etching process which anisotropically etches one crystalline form of silicon more rapidly than another crystalline form of silicon.

In the fabrication of certain semiconductor devices there is a need to etch polycrystalline silicon without, at the same time, etching monocrystalline silicon. For example, in the fabrication of certain erasable programmable read only memories (EPROM) and electrically erasable programmable read only memories (EEPROM) the monocrystalline silicon substrate is unavoidably exposed to the same etchant used to pattern a layer of polycrystalline silicon. It is deleterious to the fabrication process and to the device which is eventually produced to allow the monocrystalline silicon substrate to be etched. Accordingly, a need existed for an improved process which would allow for the anisotropic etching of polycrystalline silicon in preference to and in the presence of exposed monocrystalline silicon.

It is therefore an object of this invention to provide an improved process for the etching of polycrystalline silicon.

It is another object of this invention to provide an improved process for the anisotropic etching of polycrystalline silicon in preference to monocrystalline silicon.

It is yet another object of this invention to provide an improved process for the fabrication of a semiconductor device.

BRIEF SUMMARY OF THE INVENTION

The foregoing and other objects of the invention are achieved, in one embodiment, by a process for etching polycrystalline silicon in preference to and in the presence of exposed monocrystalline silicon. In accordance with that embodiment, a patterned layer of polycrystalline silicon is provided overlying a monocrystalline silicon substrate. A portion of the substrate is exposed through apertures in the patterned polycrystalline silicon. The polycrystalline silicon is anisotropically etched, without substantially etching the monocrystalline silicon substrate, in a noncarbonaceous plasma including chlorine and oxygen as reactants. The presence of the oxygen in this plasma reaction inhibits the etching of the monocrystalline silicon relative to the polycrystalline silicon.

DETAILED DESCRIPTION OF PREFERRED EMBODIMENTS

Figure 1:
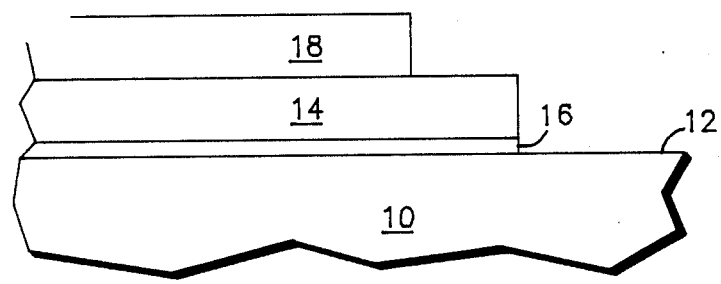
FIG. 1 illustrates, in cross-section, a representative semiconductor structure to which the invention applies.

FIG. 1 illustrates, schematically, a structure which can be encountered during the processing of certain semiconductor devices. Such a structure may occur, for example, in the fabrication of EPROM or EEPROM devices, devices such as microprocessors which include EPROM or EEPROM structures, Josephson Junction devices, or other devices which require two masking steps for the final patterning of a polycrystalline silicon layer. FIG. 1, while not necessarily depicting any actual semiconductor device structure, serves to illustrate the application of the invention to the fabrication of a semiconductor device.

The structure illustrated in FIG. 1 includes a monocrystalline silicon substrate 10 having a generally planar surface 12. The term "monocrystalline silicon substrate" refers to the type of silicon substrates generally used in the fabrication of silicon devices and integrated circuits. Overlying the substrate is a layer 14 of polycrystalline silicon which may be separated from the substrate by a layer 16 of silicon dioxide or the like. A masking layer 18 overlies polycrystalline silicon layer 14 and acts as an etch mask to protect portions of layer 14 during a subsequent etching operation. Layer 14 has been previously patterned to provide an aperture through which a portion of surface 12 is exposed. Masking layer 18 is now used in an etching operation to again pattern polycrystalline layer 14. During the etching of polycrystalline silicon layer 14, a portion of monocrystalline silicon substrate 10 is also exposed to the etching process. In accordance with the invention, the etching of layer 14 is carried out in a manner which minimizes the simultaneous etching of substrate 10. Polycrystalline silicon layer 14 is anisotropically plasma etched in a noncarbonaceous silicon etchant to which oxygen is added. For example, in accordance with one embodiment of the invention, polycrystalline silicon layer 14 is plasma etched in a mixture of chlorine, hydrogen bromide or hydrogen iodide, oxygen, and helium. In this plasma mixture the chlorine is the basic silicon etchant, the hydrogen bromide or hydrogen iodide assists in the silicon etching and helps to improve the uniformity and anisotropy of the etching, and the helium acts as a diluent, aids in controlling the partial pressure, and helps to raise the DC component of the peak to peak voltage. The oxygen causes the etching reaction to be highly selective so that the polycrystalline silicon etches at a rate much higher than the monocrystalline silicon.

Although the inventor does not wish to be bound by any possible theoretical basis for his invention, he believes that the addition of oxygen to the plasma during the etching causes an oxidation and thus a passivation of the exposed monocrystalline silicon substrate. He believes that the oxygen penetrates the crystalline lattice of the monocrystalline silicon to occupy interstitial sites in the lattice and to form a pseudo silicon dioxide film in the top layers of the silicon substrate. In contrast, the oxygen migrates along grain boundries in the polycrystalline silicon (in a manner similar to phosphorous dopant atoms) and does not form a passivating oxide layer. The unpassivated polycrystalline silicon layer then etches much more rapidly in the selected etch chemistry than does the the in situ formed passivating oxide layer. This, in turn, causes the polycrystalline silicon to etch in preference to the monocrystalline silicon. The mechanism is thus different than in the case of etching silicon in preference to silicon dioxide.

In addition to chlorine, other noncarbonaceus silicon etchants such as $NF_3$, HCl, $ClF_3$ or $SF_6$ can also be used. Carbonaceous silicon etchants are not preferred because the carbon in the plasma combines with the oxygen and reduces the oxygen below the effective level.

The noncarbonaceous reactants are selected to etch the polycrystalline silicon and to allow the oxygen to form a passivating oxide coating on the monocrystalline silicon. The various silicon etchants, together with oxygen, are believed to react as follows:

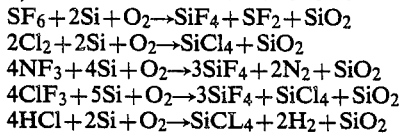

The reaction products in each of these reactions are all gaseous except for the $SiO_2$ which is solid and is formed in the near surface monolayers of the monocrystalline silicon substrate. As a specific, but non-limiting example, the structure as illustrated in FIG. 1 was etched as follows. Polycrystalline silicon layer 14 had a thickness of approximately 250 nanometers and was masked by a silicon dioxide layer 18. The polycrystalline silicon was etched in a Zylin ZLN20 single wafer etching reactor made by Zylin, Inc., a component of Varian Associates. The reactor was operated in the reactive ion etch mode. The electrode plates of the reactor were water cooled to about 5 degrees Celsius and were spaced about 0.95 centimeters apart. The reactants were 35 sccm $Cl_2$, 15 sccm HBr, 50 sccm He, and 0.4–1.5 sccm $O_2$. The power was maintained at 250 watts at a frequency of 13.56 Mhz. The pressure in the reactor was maintained at about 40 Pa the end point of the reaction was optically controlled by observing the 410 nm line which is basically a silicon chloride or $SiCl_x$ line. The reaction was continued for approximately 60 seconds to remove the polycrystalline silicon layer 14. All layers were then removed from the surface of the monocrystalline substrate and the substrate etching was measured with a profilometer. Although a slight etching or roughening of the surface could be optically observed on those portions of the substrate surface which were exposed during the etching, no etching could be measured by the profilometer.

In the reaction described above, using less than about 0.4 volume percent of oxygen does not adequately suppress the etching of the monocrystalline silicon substrate. Using more than about 1.5 volume percent of oxygen unacceptably slows the etching of the polycrystalline silicon and leads to nonuniformities. The other parameters of the illustrative example are selected for control, anisotropy, and uniformity of the etch process. Additionally, the electrode plates of the reactor should be passivated with an impervious layer of material which is non reactive with the chlorine plasma. The plates are normally anodically oxidized aluminum, but pinholes through the anodic oxide expose the underlying aluminum. It is therefore desirable to coat the plates with an additional layer of, for example, flame sprayed aluminum oxide.

In a further example, a similar structure was etched as follows. The plasma reactants included 2 sccm $SF_6$, 15 sccm HBr, 35 sccm $Cl_2$ and 0.5 sccm $O_2$. The etching conditions were otherwise the same as above. After 60 seconds of etching, the polycrystalline silicon was totally etched and the exposed monocrystalline silicon was etched to a depth of about 23 nm. Thus the etch selectivity was greater than 10:1.

FIGS. 2–8 illustrate the application of the invention to the fabrication of a semiconductor device, specifically, for illustrative purposes, an EPROM. Only those process steps necessary for explaining the invention are illustrated and described. The process, of course, may include other steps which are necessary for the fabrication of a completed device but which do not involve the invention. To avoid confusion, these steps which are conventionally used in semiconductor processing have not been shown.

Figure 2:
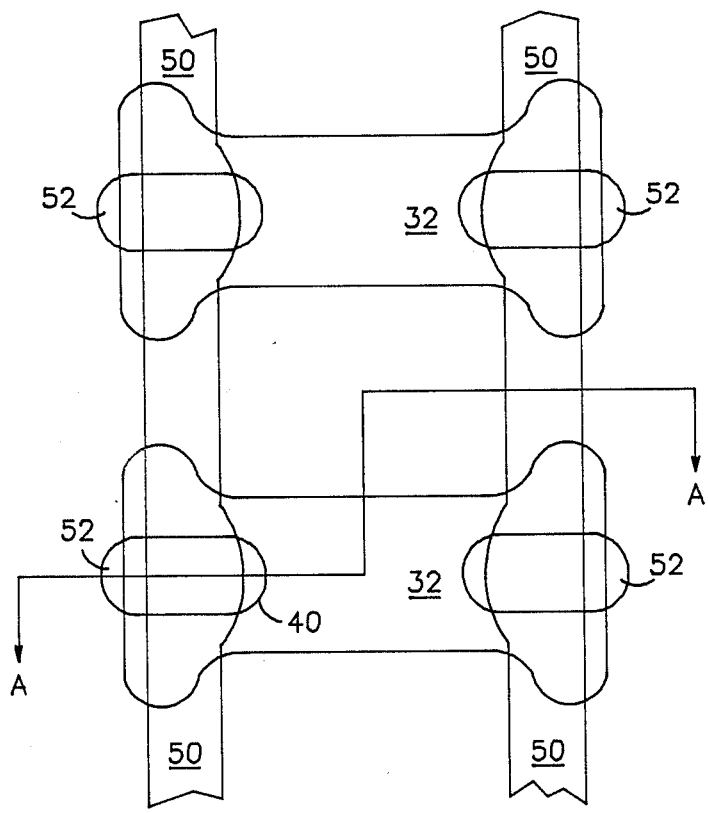
FIG. 2 illustrates, in plan view, composite masking of a portion of an EPROM device fabricated in accordance with the invention.

FIG. 2 illustrates, in plan view, the composite masking of several layers used in fabrication of a portion of an EPROM memory array. FIGS. 3–8 illustrate, in cross-section, process steps, in accordance with the invention, used in fabricating the device. The cross-sections are taken through the section AA as illustrated in FIG. 2. The process steps illustrated are the layer formation and etching steps which are relevant, in the fabrication sequence, to the invention. Earlier process steps relating to isolation between devices, ion implantation or diffusion steps in the formation of doped regions, and the backend processing steps are not relevant to the invention and thus are not discussed.

Figure 3:
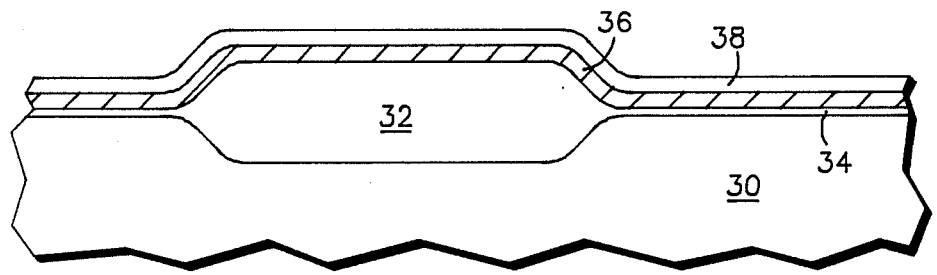
FIGS. 3–8 illustrate, in cross-section, process steps in accordance with one embodiment of the invention used in fabrication of an EPROM device.

FIG. 3 illustrates, in cross-section, a portion of a monocrystalline silicon substrate 30. Substrate 30 is separated, at the surface, into a plurality of active device regions by a thick field oxide 32. A thin oxide layer 34, which will be used, in part, as a gate oxide, is formed on the surface of substrate 30 in the active device regions. Overlying the gate oxide and the field oxide is a first layer 36 of polycrystalline silicon. This polycrystalline silicon layer will be used to form a floating gate electrode of the EPROM device. Overlying polycrystalline silicon layer 36 is an interlayer dielectric 38. This interlayer dielectric can be an oxide, nitride, oxide-nitride-oxide, or the like. Although not essential to the invention, gate oxide 34 is preferably a thermally grown oxide having a thickness of about 25 nanometers, polycrystalline silicon layer 36 is deposited by low pressure chemical vapor deposition to a thickness of about 200 nanometers, and interlayer dielectric 38 is deposited by chemical vapor deposition to a thickness of about 60 nanometers.

Figure 4:
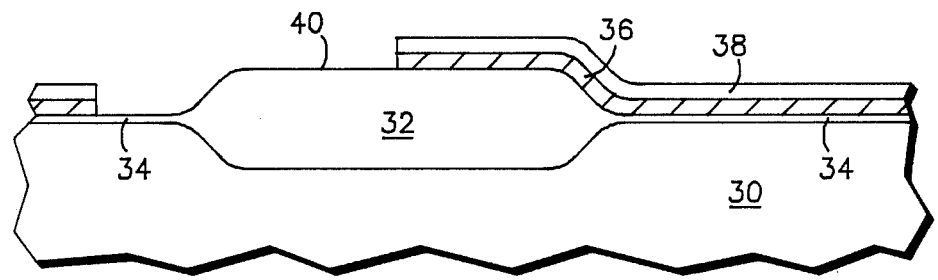

As illustrated in FIG. 4, the interlayer dielectric and polycrystalline silicon layers are patterned using conventional photolithographic techniques to form an aperture 40. Aperture 40 exposes a portion of the underlying field oxide 32 and gate oxide 34.

Figure 5:
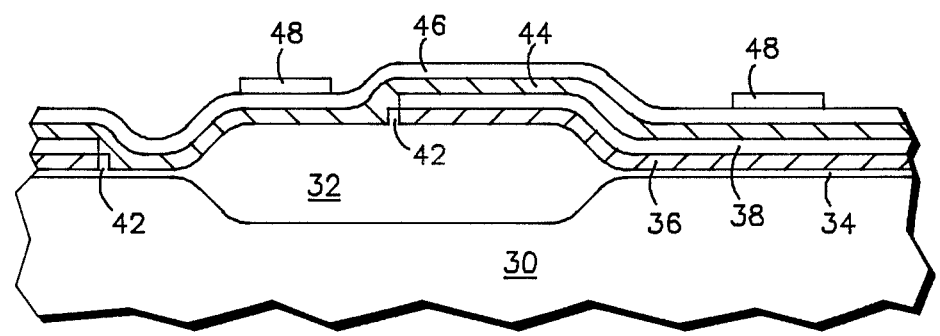

The process is continued, as illustrated in FIG. 5, by thermally oxidizing the edges of polycrystalline silicon layer 36 which are exposed during the formation of aperture 40. The oxidation of polycrystalline silicon layer 36 is accomplished by thermal oxidation and forms oxide regions 42. After the oxidation step, a second polycrystalline silicon layer 44 is deposited, again by low pressure chemical vapor deposition. Oxide regions 42 provide isolation between polycrystalline silicon layers 36 and 44. An additional layer of insulating material 46 is deposited overlying the second layer of polycrystalline silicon. Insulating layer 46 can be, for example, a low temperature deposited oxide. A photoresist layer 48 is then deposited and patterned to act as an etch mask in the patterning of the second polysilicon layer 44 and the overlying insulator.

Figure 6:
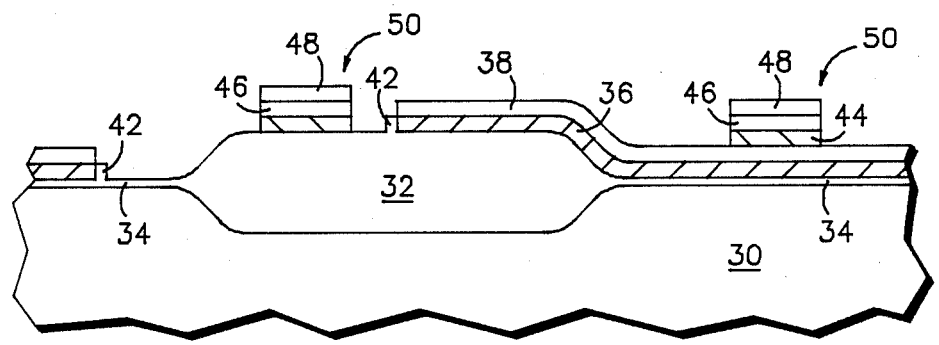
Figure 7:
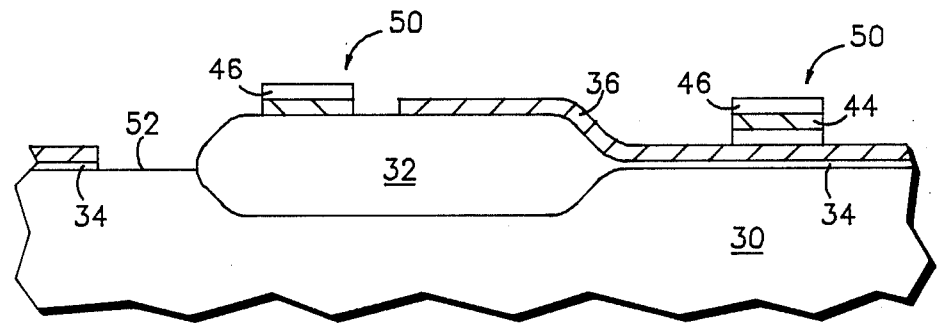
Figure 8:
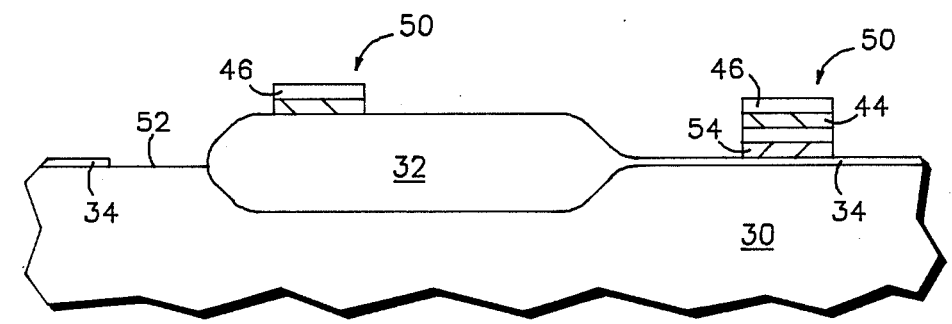

Using the patterned photoresist 48 as an etch mask, insulated layer 46 and second polycrystalline layer 44 are patterned as illustrated in FIG. 6. Where the first polycrystalline silicon layer had previously been removed, this etching step again exposes portions of gate oxide 34 and field oxide 32. The etching results in stripes 50 of insulator and second polycrystalline silicon as better illustrated in FIG. 2.

Because of thermal processing (not shown) which is done at this stage of the process, the photoresist mask 48 must be moved before any further patterning is done. Using the stripes 50 of insulator material 46 and second polycrystalline silicon layer 44 as an etch mask, the interlayer dielectric 38 is etched, for example, by plasma etching in $CHF_3$ and $O_2$. (Here the role of the $O_2$ is to react with the carbon of the $CHF_3$ to form $CO_2$ and to free flourine to etch the dielectric material. This is not to be confused with the role of $O_2$ in the inventive process.) During this etch step the exposed portion of gate oxide 34 as well as oxide 42 on the exposed portions of polycrystalline layer 36 are also removed. A portion of the surface of substrate 30 indicated by the number 52 is thus exposed.

The exposed portion of polycrystalline silicon layer 36 is now etched to form a floating gate in self alignment with selected portions of stripe 50. It is during the second patterning of the polycrystalline silicon layer 36 that a selective etch is required since portion 52 of the monocrystalline silicon substrate is also exposed to the etchant.

In accordance with the preferred embodiment of the invention, polycrystalline silicon layer 36 is anisotropically etched to form floating gate 54 in self alignment with stripe 50 without etching the exposed portion 52 monocrystalline substrate 30. This is accomplished in a plasma etch utilizing a non-carbonaceus silicon etchant together with about 0.4–1.5 volume percent of oxygen as detailed above. The etching of polycrystalline silicon layer 36 is accomplished using this etchant without excessive pitting or trenching of the monocrystalline silicon substrate at exposed portion 52. The fabrication of the illustrative EPROM device is then completed in the conventional manner.

Thus it is apparent that there has been provided, in accordance with the invention, a process for preferentially etching polycrystalline silicon relative to monocrystalline silicon and for the fabrication of semiconductor devices. Although the invention has been described with reference to specific preferred embodiments, it is not intended that the invention be limited to these illustrative embodiments. Those skilled in the art will recognize that variations and modifications can be made without departing from the spirit of the invention. For example, the proportions of gaseous reactants as well as other physical parameters in the plasma etching can be changed to meet a particular etch requirement. Accordingly, it is intended to include all such variations and modifications within the scope of the appended claims.

I claim:

1. A process for etching polycrystalline silicon in preference to and in the presence of exposed monocrystalline silicon comprising the steps of:
   providing a monocrystalline silicon substrate;
   providing a patterned layer of polycrystalline silicon overlying said substrate and exposing a portion of said substrate;
   anisotropically etching said patterned layer of polycrystalline silicon in a plasma comprising a noncarbonaceous compound of chlorine and oxygen as reactants;
   controlling the composition of said reactants so that the surface of said monocrystalline silicon substrate is not substantially etched.

2. The process of claim 1 wherein said compound comprises $Cl_2$, $ClF_3$ or $HCl$.

3. The process of claim 1 wherein said plasma further comprises HBr or HI as reactants.

4. The process of claim 1 wherein said plasma comprises $Cl_2$, HBr, $O_2$ and He as reactants.

5. The process of claim 1 wherein said oxygen comprises about 0.4 to about 1.5 percent by volume of said reactants.

6. A process for fabricating a semiconductor device which comprises the steps of:
   providing a monocrystalline silicon substrate having a major surface;
   providing a first layer of insulating material overlying said major surface;
   depositing a second layer of polycrystalline silicon overlying said first layer;
   patterning said second layer and said first layer to expose a portion of said surface of said monocrystalline silicon substrate;
   anisotropically etching said patterned layer of polycrystalline silicon in a plasma comprising a noncarbonaceous etchant for silicon and oxygen as reactants;
   controlling the composition of said reactants so that the surface of said monocrystalline silicon substrate is not substantially etched.

7. The process of claim 6 wherein said noncarbonaceous silicon etchant comprises a compound selected from the group consisting of Cl$_2$, SF$_6$, NF$_3$, ClF$_3$, HCl, and combinations thereof.

8. The process of claim 7 wherein said noncarbonaceous silicon etchant comprises SF$_6$.

9. The process of claim 6 wherein said reactants further comprises HBr.

10. The process of claim 6 wherein said oxygen comprises about 0.4 to about 1.5 percent by volume of said reactants.

11. A process for fabricating a semiconductor device which comprises the steps of:
   providing a monocrystalline silicon substrate;
   forming a gate insulator overlying said substrate;
   depositing a first layer of polycrystalline silicon overlying said gate insulator;
   forming an interlayer dielectric overlying said first layer;
   patterning said interlayer dielectric and said first layer of polycrystalline silicon;
   depositing a second layer of polycrystalline silicon overlying said patterned interlayer dielectric and first layer of polycrystalline silicon;
   patterning said second layer of polycrystalline silicon, said interlayer dielectric, and a portion of said gate insulator to thereby expose a portion of said monocrystalline silicon substrate;
   anisotropically etching said first layer of polycrystalline silicon in self alignment with said second layer of polycrystalline silicon, said etching comprising subjecting said second layer of polycrystalline silicon to a plasma including a noncarbonaceous etchant for silicon and oygen;
   controlling the composition of said plasma so that the surface of said monocrystalline silicon substrate is not substantially etched.

12. The process of claim 11 wherein said noncarbonaceous silicon etchant is selected from the group consisting of CL$_2$, HCl, SF$_6$, NF$_3$, ClF$_3$, and combinations thereof.

13. The process of claim 11 wherein said plasma includes reactants Cl$_2$, HBr, He, and O$_2$.

14. The process of claim 13 wherein said O$_2$ is present in an amount equal to about 0.4–1.5 percent by volume of said reactants.

* * * * *